United States Patent [19]
Horiguchi et al.

[11] Patent Number: 5,983,358
[45] Date of Patent: Nov. 9, 1999

[54] SEMICONDUCTOR MEMORY HAVING REDUNDANCY CIRCUIT

[75] Inventors: Masashi Horiguchi, Kawasaki; Shinichi Miyatake, Hamura; Tathunori Mushya, Fussa; Yasuhiro Kasama, Musashino; Yoichi Matsuno; Yasushi Kawase, both of Kokubunji; Yoshinobu Nakagome, Hamura, all of Japan

[73] Assignees: Hitachi, Ltd.; Hitachi Ulsi Engineering Corp., both of Tokyo; Hitachi Device Engineering Co., Ltd., Mobara, all of Japan

[21] Appl. No.: 08/938,962

[22] Filed: Sep. 26, 1997

[30] Foreign Application Priority Data

Sep. 27, 1996 [JP] Japan .................................. 8-255831

[51] Int. Cl.⁶ .................................................. G06F 11/00
[52] U.S. Cl. ............................................................... 714/6
[58] Field of Search .................................. 714/6, 5, 710, 714/711, 718, 733; 365/149, 45

[56] References Cited

U.S. PATENT DOCUMENTS

| | | | |
|---|---|---|---|
| 4,661,929 | 4/1987 | Aoki et al. ............................... | 365/149 |
| 4,709,350 | 11/1987 | Nakagome et al. ....................... | 365/45 |
| 5,487,039 | 1/1996 | Sukegawa ................... | 714/711 |
| 5,528,539 | 6/1996 | Ong et al. ............................... | 714/711 |
| 5,689,465 | 11/1997 | Sukegawa et al. ..................... | 714/710 |
| 5,706,292 | 1/1998 | Merritt .................................... | 714/733 |
| 5,845,319 | 12/1998 | Yorimitsu ................................ | 711/114 |

FOREIGN PATENT DOCUMENTS

| | | |
|---|---|---|
| 59-135700 | 8/1984 | Japan . |
| 60-130139 | 7/1985 | Japan . |
| 62184700A | 8/1987 | Japan . |
| 01224998A | 9/1989 | Japan . |
| 07320496A | 12/1995 | Japan . |

*Primary Examiner*—Robert W. Beausoliel, Jr.
*Assistant Examiner*—Pierre E. Elisca
*Attorney, Agent, or Firm*—Beall Law Offices

[57] ABSTRACT

A semiconductor memory having a redundancy circuit includes a judgment device for receiving outputs of first ROMs for storing a defective address therein and judging whether or not a defective memory cell and a spare memory cell to replace the defective memory cell belong to the same memory cell, and also includes a timing adjustment circuit for changing the timing of control signals applied to memory mat control circuits according to an output of the judgment device. When the defective and spare memory cells belong to the same memory mat, the timing of the control signals is made fast.

15 Claims, 15 Drawing Sheets

FIG. 16A

| E0 | F0n | JUDGEMENT RESULT |
|----|-----|------------------|
| 0  | X   | WITHIN MAT       |
| 1  | 0   | WITHIN MAT       |
| 1  | 1   | INTERMAT         |

"X" DENOTES 'DON'T CARE'

FIG. 16B

| E1 | F1n | JUDGEMENT RESULT |
|----|-----|------------------|
| 0  | X   | WITHIN MAT       |
| 1  | 0   | INTERMAT         |
| 1  | 1   | WITHIN MAT       |

"X" DENOTES 'DON'T CARE'

SEMICONDUCTOR MEMORY HAVING REDUNDANCY CIRCUIT

BACKGROUND OF THE INVENTION

The present invention relates to a redundancy technique in a semiconductor memory and more particularly, to a semiconductor memory having a redundancy circuit suitable for high-speed operation.

Redundancy in memory cells is a technique conventionally well known for improving yield in semiconductor memory operation. In this technique, spare memory cells are previously provided on a semiconductor chip so that a defective memory cell is replaced by a spare memory cell to thereby improve the product yield. The above replacement is carried out usually on a single- or plural word line or bit line basis.

Meanwhile, in recent semiconductor memories, a memory array for arranging memory cells thereon is often divided (mat division) into a plurality of zones called memory mats or subarrays. This is carried out by such a circuit demand as shortening of a signal delay time or securing of a desired signal-to-noise ratio. When the aforementioned redundancy technique is applied to the mat-divided semiconductor memory, it is common to replace a defective memory mat by a spare line of the same mat. When there are many defects in a single memory mat, however, there occurs such a problem that the number of spare lines becomes insufficient for the memory mat. A method for effectively solving the problem is disclosed in JP-A-59-135700 and JP-A-60-130139. In these Publications, it is suggested that, when there are defects in a memory mat, they may be replaced even by spare lines of other memory mats. Of course, the defects can be replaced even by the spare lines of the same memory mat. With such an arrangement, interchange of the spare lines can be realized between memory mats, thus expectedly improving its yield.

SUMMARY OF THE INVENTION

It is therefore an object of the present invention to provide a semiconductor memory having a redundancy circuit which can operate at a high speed by minimizing a delay in activation timing of memory mats.

A problem with the aforementioned prior art is that access time is increased, the reason for which will be explained in the following.

In a mat-divided semiconductor memory, all the memory mats are not activated at the same time but usually one or a small number of memory mats are activated at the same time. In order to select activated ones of the memory mats, it is common to provide a mat control circuit for each memory mat. The mat control circuit, when receiving an address signal, acts to determine whether or not to activate the associated memory mat.

When the aforementioned redundancy method is not used, the mat control circuit determines whether to activate the associated memory mat only on the basis of the received address signal (usually, the upper address signal for selecting the memory mat). When the aforementioned redundancy method is used, on the other hand, the mat control circuit cannot make a determination on the basis of only the address signal. This is because, in the presence of a defect in the selected address, the memory mat to be selected may be possibly changed. The mat control circuit, only after obtaining a result of comparison of the address signal with an output of a ROM (in which a defective address is stored), can determine whether or not to activate the associated memory mat. Accordingly, the timing of activating the memory mat must be delayed by the time period necessary for the comparison. In addition, since the above time may vary even with the process variations, temperature or the values written in the ROM, a sufficient margin must be considered so as not to cause erroneous operation even in the worst case, otherwise there is undesirably a possibility that an incorrect memory mat may be temporarily activated. In particular, in the case of a dynamic random access memory (DRAM), temporary activation of an incorrect memory mat may cause destruction of information stored therein. For this reason, the temporary activation of an incorrect memory mat must be avoided.

In this way, in the prior art, the feasibility of the replacement between the memory mats also causes the possibility that the memory mat to be activated is changed to another memory mat, for which reason the timing of activating the memory mat must be delayed. As microprocessors are made higher in operational speed and image processing applications are made broader, not only increased memory capacity but also higher-speed operation has recently been demanded even for a main memory. For this reason, high-speed DRAMs as the main memories have been increasingly demanded. However, it has been difficult to obtain high speed operation in the prior art redundancy technique because of the problem with the memory mat activation timing.

The present invention is directed to implementation of a semiconductor memory having a redundancy circuit which can solve the above problem in the prior art and can operate at a high speed by minimizing a delay in activation timing of memory mats.

In order to solve the above problem, in accordance with the present invention, there are provided a judgement circuit for receiving outputs of ROMs for storing defective addresses therein and judging whether or not a defective memory cell and a spare memory cell to replace it belong to the same memory mat, and a timing adjustment circuit for changing the timing of control signals applied to memory mat control circuits according to an output of the judgement circuit. As a result, when the defective memory cell and the spare memory cell to replace it belong to the same memory mat, the timing of the control signals is made early to shorten an access time.

More specifically, in accordance with an aspect of the present invention, there is provided a semiconductor memory having a redundancy circuit which comprises a plurality of memory mats (M0, M1) each including a plurality of normal memory cells and a plurality of spare memory cells, a plurality of memory mat control circuits (MC0, MC1) for controlling said plurality of memory mats respectively, first ROMs (ROM0, ROM1) for storing therein an address of a defective one of the normal memory cells, comparison circuits (AC0, AC1) for comparing outputs of the first ROMs (ROM0, ROM1) with an address signal, spare selection circuits (R0, R1) for selecting the spare memory cell in place of the defective memory cell according to outputs of the comparison circuits, a mode setting circuit (JC) for setting an operational mode associated with a replacement type between the normal and spare memory cells, and a timing adjustment circuit (TA) for changing the timing of control signals (MS0, MS1) applied to the memory mat control circuits on the basis of an output of the mode setting circuit. The mode setting circuit judges whether or not the defective memory cell and the spare memory cell to replace it belong to the same memory mat and/or whether or not the spare memory cell is used, and sets the operational mode on the basis of the judgement result. Further, the mode setting circuit includes a judgement circuit for receiving outputs of the first ROMs (ROM0, ROM1) and judging whether or not the defective memory cell and the spare memory cell to replace it belong to the same memory mat and/or whether or not the spare memory cell is used.

A wiring layer of input/output signals of the judgement circuit is made larger in resistive value per unit length than a wiring layer of the address signal, and is provided as a layer under the wiring layer of the address signal.

The mode setting circuit further includes a second ROM (ROM2) for previously writing therein whether or not the defective memory cell and the spare memory cell to replace it belong to the same memory mat and/or whether or not the spare memory cell is used, and an apparatus which sets the operational mode on the basis of the written contents of the second ROM.

As has been explained in the foregoing, in accordance with the present invention, the invention can be made faster in operational speed than the prior art when the intermat replacement is not present, whereas, the invention can be made much faster when the chip is a perfect good product or when defects are relatively small in number and thus can be repaired only with the spare it lines without using the spare word lines. Accordingly, in the case of a relatively small number of defects, a high percentage of good high-speed chips can be obtained which are suitable for high-speed microprocessors or image processing applications.

BRIEF DESCRIPTION OF THE DRAWINGS

FIGS. 16A and 16B are truth tables for the judgement circuit of FIG. 8.

DESCRIPTION OF THE PREFERRED EMBODIMENTS

Embodiments of the present invention will be explained in detail with reference to the accompanying drawings.

Embodiment 1

Figure 1:
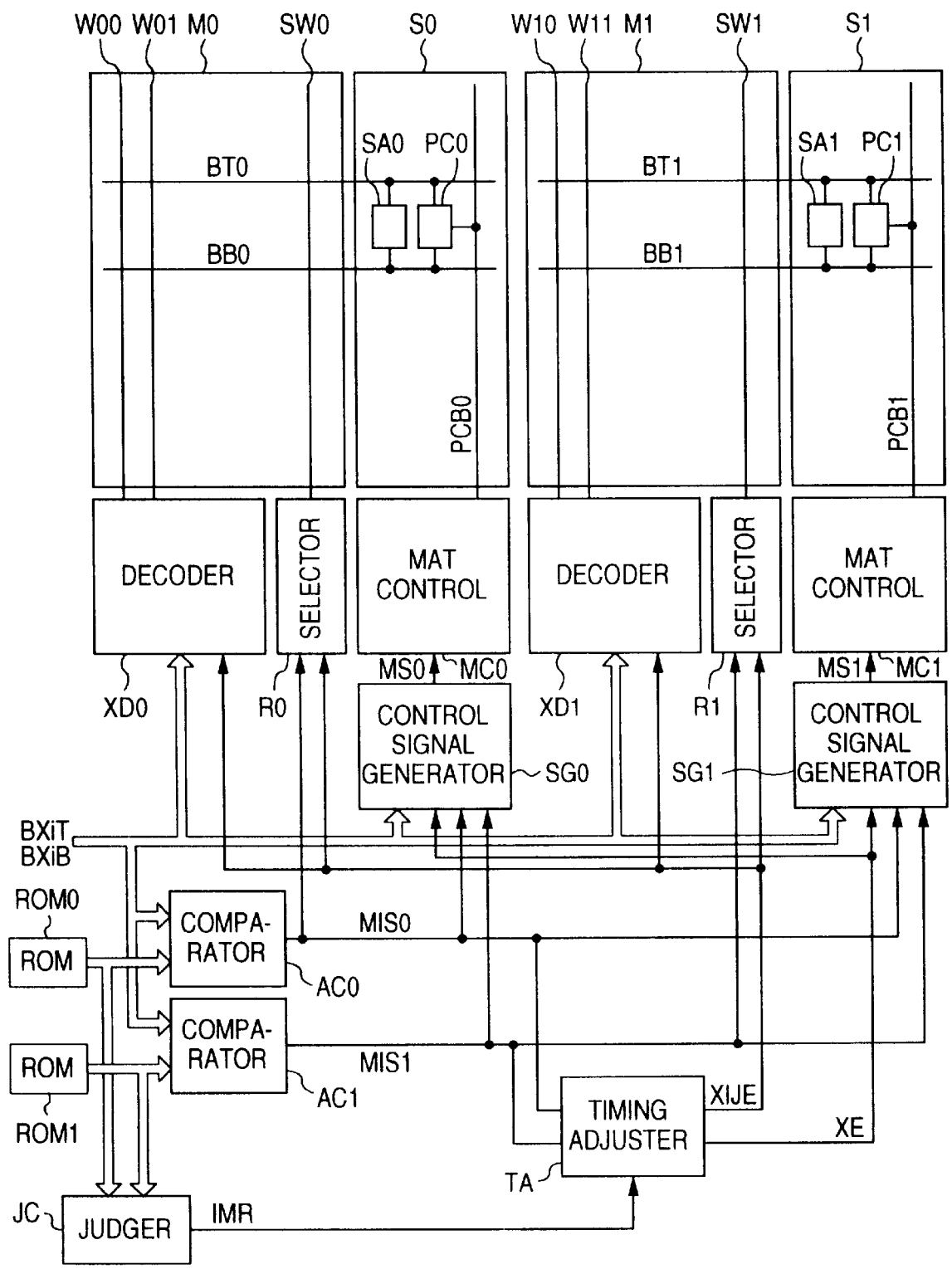
FIG. 1 shows a DRAM in accordance with a first embodiment of the present invention.

FIG. 1 shows an example in which the present invention is applied to redundancy of word lines in a DRAM (dynamic random access memory). In the drawing, reference symbols M0 and M1 denote memory mats; W00, W01, W10 and W11 denote normal word lines; SW0 and SW1 denote spare word lines; and BT0 and BB0, BT1 and BB1 denote bit line pairs, respectively. Though omitted in the drawing for the sake of simplicity, a memory cell is arranged at each intersection of the word lines and bit line pairs. Reference symbols S0 and S1 denote sense circuits for amplifying associated signal voltages on the associated bit line pairs; XD0 and XD1 denote row decoders for selecting normal word lines; R0 and R1 denote spare word line select circuits; MC0 and MC1 denote mat control circuits for controlling the respective memory mats M0 and M1; SG0 and SG1 denote control signal generation circuits for providing the control signals (mat select signals MS0 and MS1) to the mat control circuits MC0 and MC1; and ROM0 and ROM1 denote ROMs for storing therein addresses of defective word lines. The ROM0 stores therein an address of a word line to be replaced by the spare word line SW0, while the ROM1 stores therein an address of a word line to be replaced by the spare word line SW1. The ROM may comprise a fuse to be cut off by a laser beam or electrically. Reference symbols AC0 and AC1 denote comparison circuits for comparing internal address signals BXiT and BXiB with addresses stored in the ROMs ROM0 and ROM1 respectively.

Explanation will next be made as to a circuit configuration of the sense circuit S0 (similar to the sense circuit S1) by referring to FIG. 2.

Figure 2:
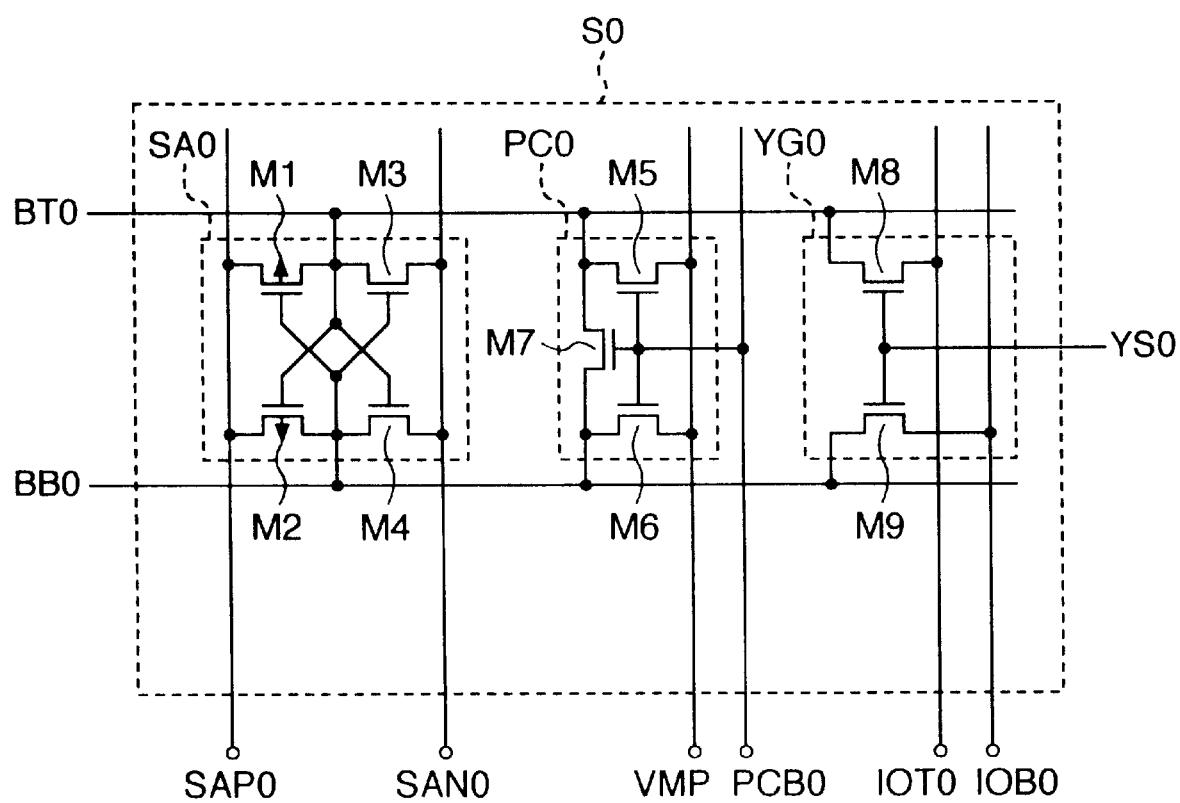
FIG. 2 is a circuit diagram of a sense circuit in the DRAM of FIG. 1.

In FIG. 2, SA0 denotes a sense amplifier which includes P-channel MOS transistors M1 and M2 and N-channel MOS transistors M3 and M4. Reference symbol PC0 denotes a precharge circuit for precharging the bit line pair (BT0, BB0), which circuit includes 3 N-channel MOS transistors M5 to M7. Symbol YG0 denotes an input/output gate for connecting the bit line pair (BT0, BB0) and input/output line pair (IOT0, IOB0), which gate includes 2 N-channel MOS transistors M8 and M9. The N-channel MOS transistors M8 and M9 are controlled by an output signal YS0 of a column decoder (not shown).

In the present embodiment, when one of the normal word lines within the memory mat M0 becomes defective, the defective word line may be replaced by the spare word line SW0 of the memory mat M0 or by the spare word line SW1 of the memory mat M1. The former is called within-mat replacement, while the latter is called intermat replacement. When one of the normal word lines within the memory mat M1 becomes defective, on the other hand, the defective word line may be replaced by the spare word line SW0 or SW1, in which case the former is called intermat replacement and the latter is called within-mat replacement. In either case, it is only required to previously write the address of the defective word line in the ROM0 when the spare word line SW0 is used and in the ROM1 when the spare word line SW1 is used.

The embodiment of the present invention shown in FIG. 1 is featured by provision of the judgement circuit JC and timing adjustment circuit TA. The judgement circuit JC, which receives outputs of the ROM0 and ROM1, judges the presence or absence of the intermat replacement. More specifically, the judgement circuit JC determines "the presence of the intermat replacement" only when the defective address of the normal word line of the memory mat M1 is written in the ROM0 or when the defective address of the normal word line of the memory at M0 is written in the ROM1. When determining "the absence of the intermat replacement", the judgement circuit JC outputs a low level ("0") of output signal IMR; whereas, when determining "the presence of the intermat replacement", the judgement circuit JC outputs a high level ("1") of output signal IMR.

In the present embodiment, one spare word line (SW0 or SW1) is provided for each of the memory mats, so that, when the normal word line to be replaced by the spare word line SW0 belongs to the memory mat M0 and when the normal word line to be replaced by the spare word line SW1 belongs to the memory mat M1, the output signal IMR is set at its level "0" (the absence of the intermat replacement); whereas, otherwise, the output signal IMR is set at its level "1" (the presence of the intermat replacement).

The timing adjustment circuit TA changes the timing of timing signals XE and XIJE in accordance with the output signal IMR of the judgement circuit JC. The timing signal XE determines the timing of the memory mat selection while the timing signal XIJE determines the timing of the word line selection, details of which will be explained later.

The operation of the present embodiment will then be explained with reference to the drawings.

Figure 3:
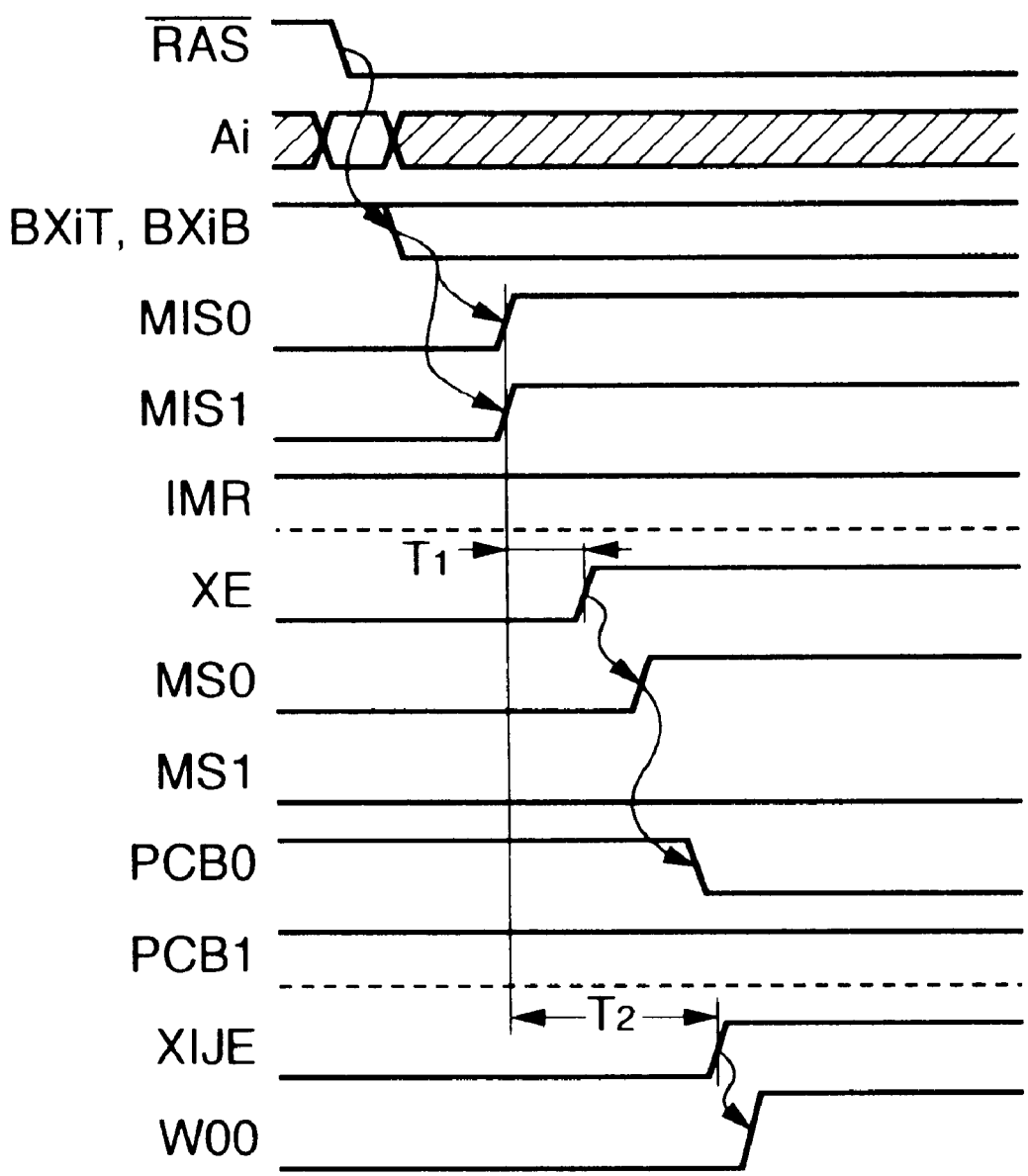
FIG. 3 shows waveforms of signals appearing in the DRAM of FIG. 1.
Figure 4:
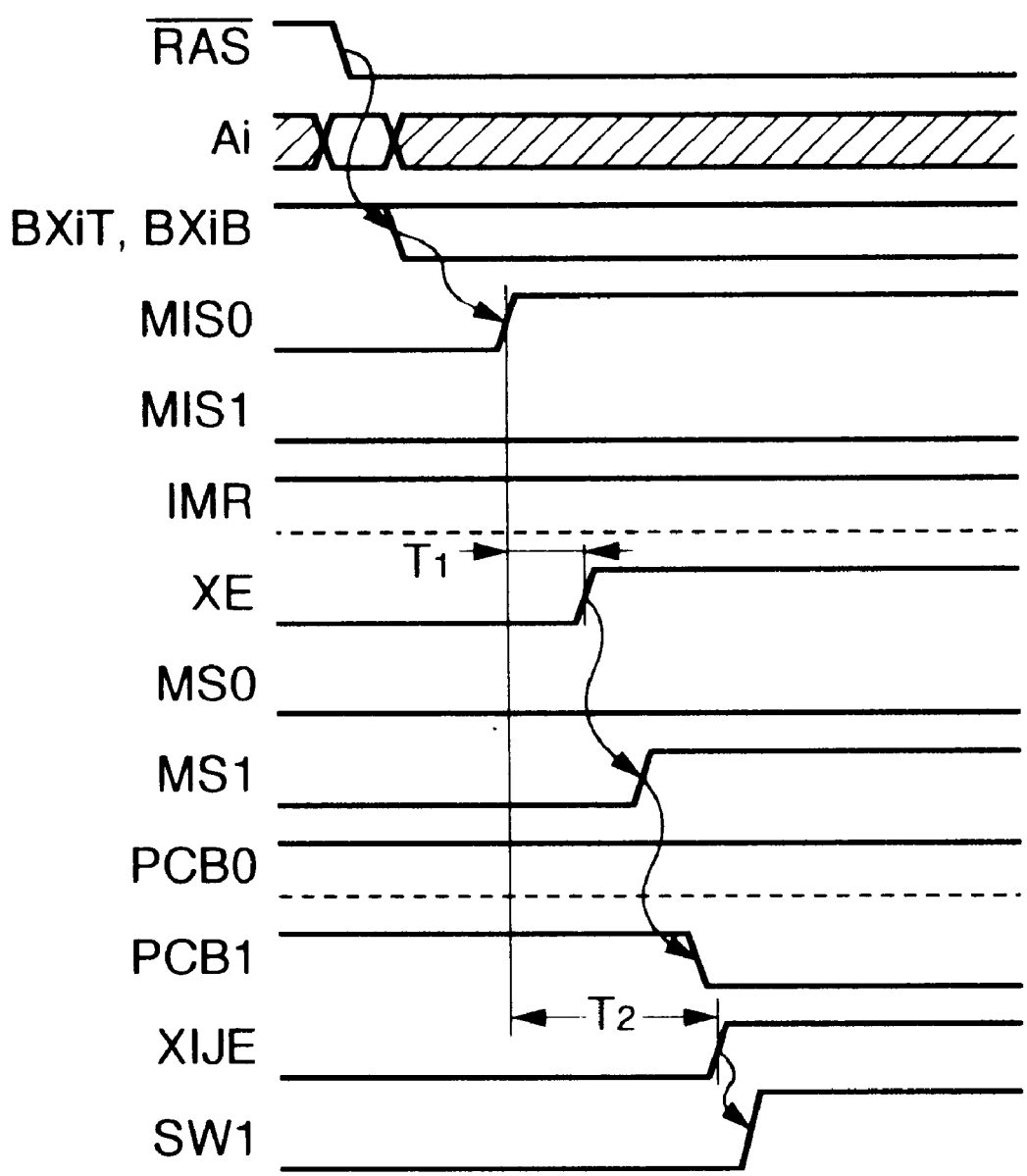
FIG. 4 shows waveforms of signals appearing in the DRAM of FIG. 1.

Now consider a defective memory cell to be present on the normal word line W01 of the memory mat M0. Shown in FIGS. 3 and 4 are waveforms of signals when the normal word line W01 has been replaced by the spare word line SW1 of the memory mat M1, during a time duration after application of a row address strobe signal/RAS until the word line rises. In this connection, the symbol "/" refers to an inverted signal. In this case, the address of the normal word line W01 is written in the ROM1. FIG. 3 is an example when the normal word line W00 (normal word line) is specified as a word line to be selected, while FIG. 4 is an example when the normal word line W01 (defective word line) is specified as a word line to be selected.

When the row address strobe signal/RAS is changed to its low level to put the DRAM in its operational state, an address signal Ai externally applied therein causes one of the internal address signals BXiT and BXiB (i=0, 1, . . . n) to be changed to its high level and the other to be changed to its low level. In this connection, the internal address signals BXiT and BXiB are complementary signals, that is, when the address signal Ai is "0", the internal address signal BXiB is at high level and the internal address signal BXiT is at low level. When the address signal Ai is "1", the situation is reversed. However, in a standby mode of the DRAM, the internal address signals are both at high level. Then, in the comparison circuits AC0 and AC1, comparison is made between the internal address signals BXiT, BXiB and outputs of the ROM0, ROM1. Outputs MIS0 and MIS1 of the comparison circuits AC0 and AC1 are changed from its low level to high when their comparison result is "non-coincidence"; whereas, the outputs remain its low level when their comparison result is "coincidence". When the normal word line W00 is specified (see FIG. 3), the outputs MIS0 and MIS1 are both at high level; whereas, when the normal word line W01 (defective word line) is specified (see FIG. 4), only the output MIS0 is at high level.

In the illustrated example, since the normal word line W01 (defective word line) of the memory mat M0 is replaced by the spare word line SW1 of the memory mat M1, this is the intermat replacement and thus the signal IMR is at high level. At this time, the timing adjustment circuit TA changes the timing signal XE from its low level to high. When the timing signal XE reaches its high level, the control signal generation circuits SG0 and SG1 judge whether or not to activate the associated mats and generate mat select signals MS0 and MS1. In FIG. 3, the normal word line W00 of the memory mat M0 is specified and the comparison result is "non-coincidence", so that the memory mat M0 is activated. Thus the mat select signal MS0 becomes high level. In FIG. 4, on the other hand, the normal word line W01 (defective word line) of the memory mat M0 is specified and the comparison result with the ROM1 is "coincidence", so that not the memory mat M0 but memory mat M1 is activated. Thus, the mat select signal MS1 becomes high level.

Thereafter, the mat control circuit MC0 or MC1 for the activated memory mat turns OFF the precharge signal PCB0 or PCB1 of their own memory mats (changes to low level). In the case of FIG. 3, the precharge signal PCB0 of the memory mat M0 is at low level but the precharge signal PCB1 of the memory mat M1 remains at high level. In the case of FIG. 4, the situation is reversed to the above. After the precharge signal is turned OFF, the timing signal XIJE is changed from its low level to high. As a result, the word line is selected. That is, in the case of FIG. 3, after the precharge signal PCB0 of the memory mat M0 is turned OFF, the normal word line W00 is selected; whereas, in the case of FIG. 4, after the precharge signal PCB1 of the memory mat M1 is turned OFF, the spare word line SW1 is selected.

Changing of the mat select signal MS0 or MS1 to the high level must be done after determination of the outputs MIS0 and MIS1 of the comparison circuits. This is because, as will be clear from the above explanation, the comparison results may cause a change of the memory mat to be activated. To avoid this, as shown in FIGS. 3 and 4, the rising of the timing signal XE is delayed by a time T1 from the transition of the output MIS0 or MIS1 of the comparison circuit. The time T1 is only required to be set at such a value as to allow for its margin so that, even when the transition timing of the outputs MIS0 and MIS1 of the comparison circuits varies with process variations or the like, erroneous operation of the DRAM can be prevented.

Figure 5:
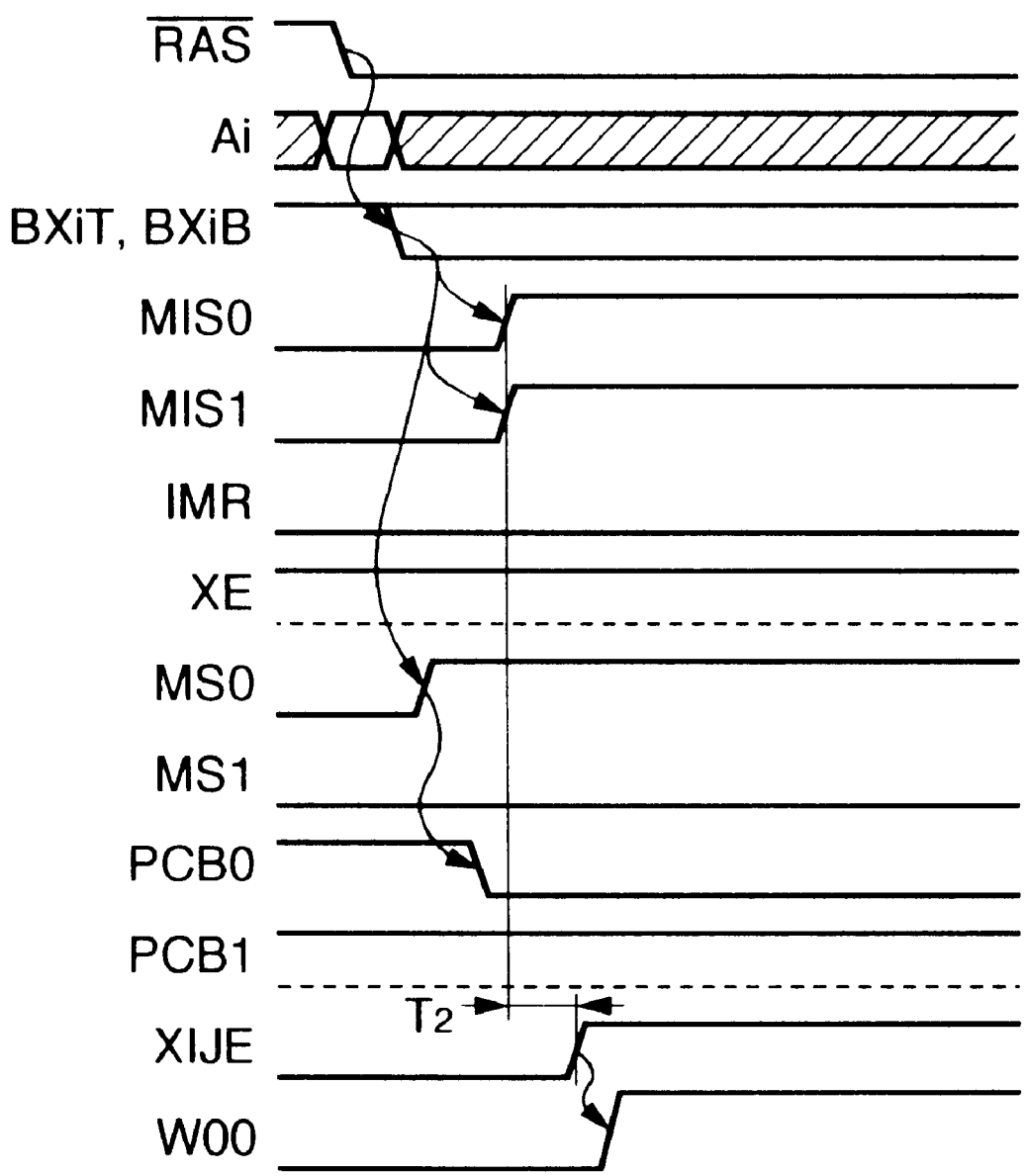
FIG. 5 shows waveforms of signals appearing in the DRAM of FIG. 1.
Figure 6:
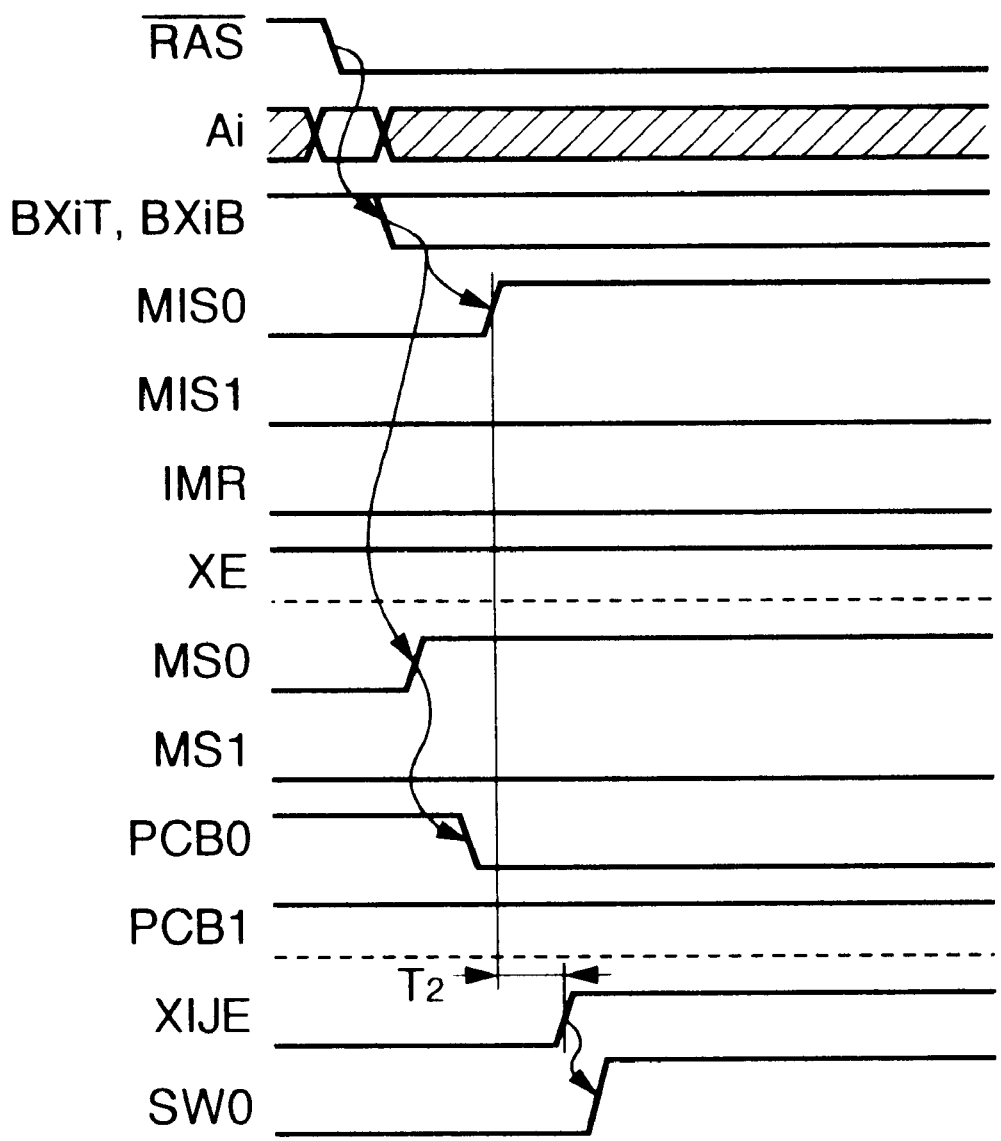
FIG. 6 shows waveforms of signals appearing in the DRAM of FIG. 1.

Referring to FIGS. 5 and 6, there are shown waveforms of signals when the normal word line W01 (defective word line) of the memory mat M0 is replaced by the spare word line SW0 on the same memory mat. In this case, the defective address of the normal word line W01 of the memory mat M0 is already written in the ROM0. FIG. 5 is an example when the normal word line W00 is specified as a word line to be selected, while FIG. 6 is an example when the normal word line W01 (defective word line) is specified as a word line to be selected.

The operations, until the outputs MIS0 and MIS1 are issued from the comparison circuits AC0 and AC1, are substantially the same as in the case of FIGS. 3 and 4. In the illustrated example, however, since there is no intermat replacement, the output IMR of the judgement circuit JC has a low level. At this time, the timing adjustment circuit TA sets its timing signal XE always at high level. Thus, the mat select signal MS0 or MS1 immediately rises as soon as the address signal transits. This is because no intermat replacement will cause no change of the memory mat to be activated based on the comparison result, so that it is unnecessary to wait for the determination of the outputs of the comparison circuits. In this case, since the mat select signal quickly rises, the timing of the timing signal XIJE can be made early and thus the timing of the word line selection can be made early. In this conjunction, in place of setting the timing signal XE always at high level, the timing signal may be set to rise simultaneously with the transition of the address signal.

Figure 7A:
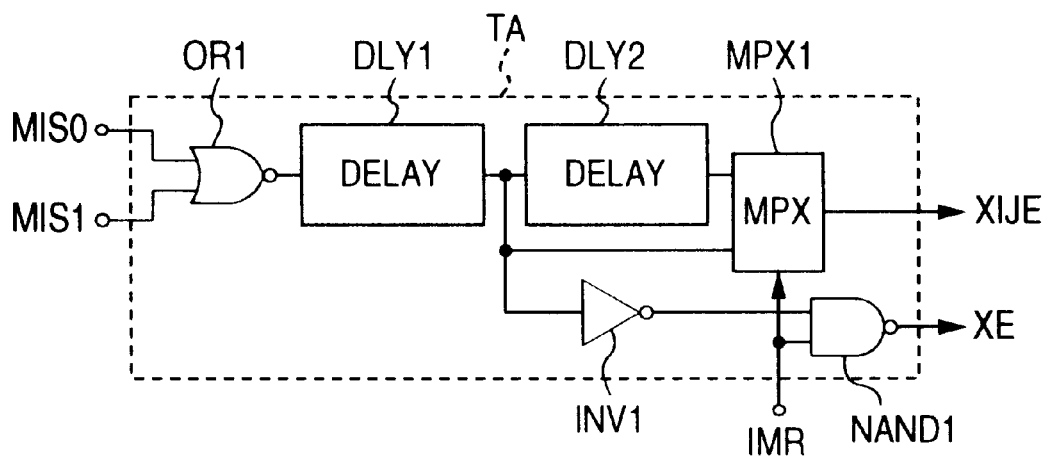
FIGS. 7A and 7B are circuit diagrams of a timing adjustment circuit TA in the DRAM of FIG. 1.

FIG. 7A shows an example of the timing adjustment circuit TA.

As will be clear from FIG. 7A, when the output signal IMR of the judgement circuit JC is at high level (the presence of the intermat replacement), a signal corresponding to a delay of a logical "OR" (OR1) of the outputs MIS0 and MIS1 of the comparison circuits AC0 and AC1 by a delay circuit DLY1 is passed through an inverter INV1 and a NAND gate NAND1 to form the timing signal XE. Since at least one of the outputs MIS0 and MIS1 of the comparison circuits AC0 and AC1 is necessarily changed from low level to high (non-coincidence), the timing signal XE also changes from its low level to high. Conversely, when the output signal IMR of the judgement circuit JC has a low level (no intermat replacement), the timing signal XE is always at high level.

Meanwhile, the timing signal XIJE corresponds to an output of a multiplexer MPX1. The multiplexer MPX1 is arranged so as to select an output of a delay circuit DLY2 when the signal IMR is at high level and to select the output of the delay circuit DLY1 when the signal IMR is at low level. Accordingly, when the signal IMR is at low level, the timing signal XIJE becomes earlier by an amount corresponding to a delay time of the delay circuit DLY2.

Figure 7B:
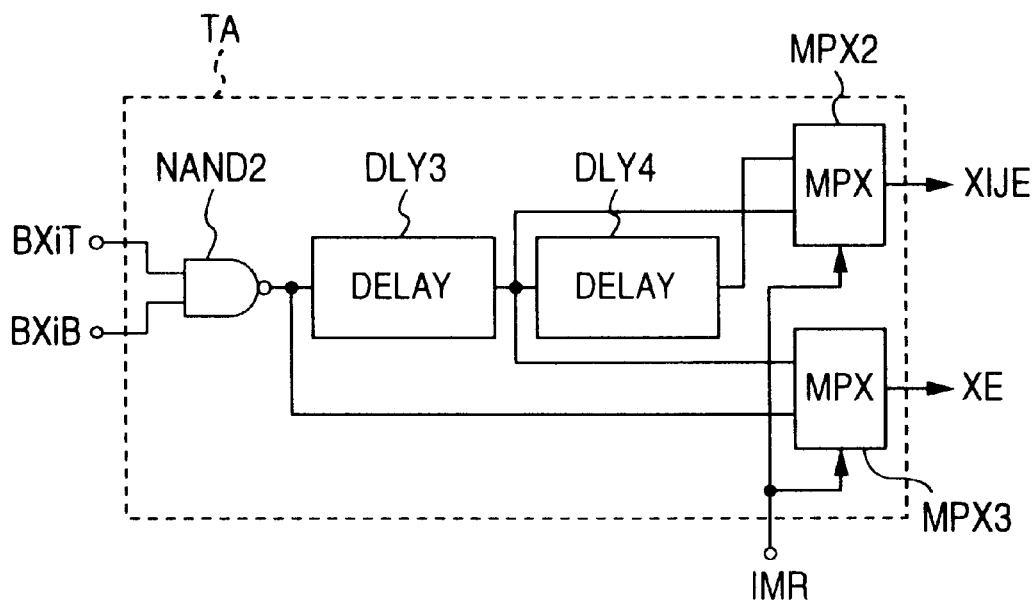

FIG. 7B is another example of the timing adjustment circuit TA. In the timing adjustment circuit TA, first of all, the internal address signals BXiT and BXiB are applied to a NAND gate NAND2. As has been explained above, in the standby mode, since the internal address signals BXiT and BXiB are both at high level, an output of the NAND gate NAND2 remains at low level. When the DRAM is put in the operational mode, one of the internal address signals BXiT and BXiB is changed necessarily from its high level to low, so that the output of the NAND gate NAND2 changes its level from low to high. The output of the NAND gate NAND2 and a signal corresponding to a delay of the NAND gate output by a delay circuit DLY3 are applied to a multiplexer MPX3, which in turn selects one of the applied signals on the basis of the output signal IMR received from the judgement circuit and issues an output XE. The multiplexer MPX3 selects the signal delayed by the delay circuit DLY3 when the signal IMR is at high level, and selects the signal not delayed by the delay circuit DLY3, i.e., selects the output of the NAND gate NAND2 when the signal IMR is at low level, thereby to output the timing signal XE.

How to generate the timing signal XIJE is substantially the same as that of the timing signal XE. More specifically, an output signal of the delay circuit DLY3 as well as a signal corresponding to a delay of the delay circuit DLY3 output by a delay circuit DLY4 are applied to a multiplexer MPX2, which in turn selects one of the applied signals on the basis of the output signal IMR received from the judgement circuit and issues the output XIJE. The multiplexer MPX2 selects the signal delayed by the delay circuit DLY4 when the signal IMR is at high level, and selects the signal not delayed by the delay circuit DLY4, i.e., the output of the delay circuit DLY3, when the signal IMR is at low level, to thereby output the timing signal XIJE.

In the case of the circuit of the present embodiment, when the signal IMR is at low level (no intermat replacement), the timing signal XE is not always at high level and rises nearly simultaneously with the transition of the internal address signal BXiT or BXiB, unlike the case of using the NAND gate NAND1 of FIG. 7A.

Figure 8A:
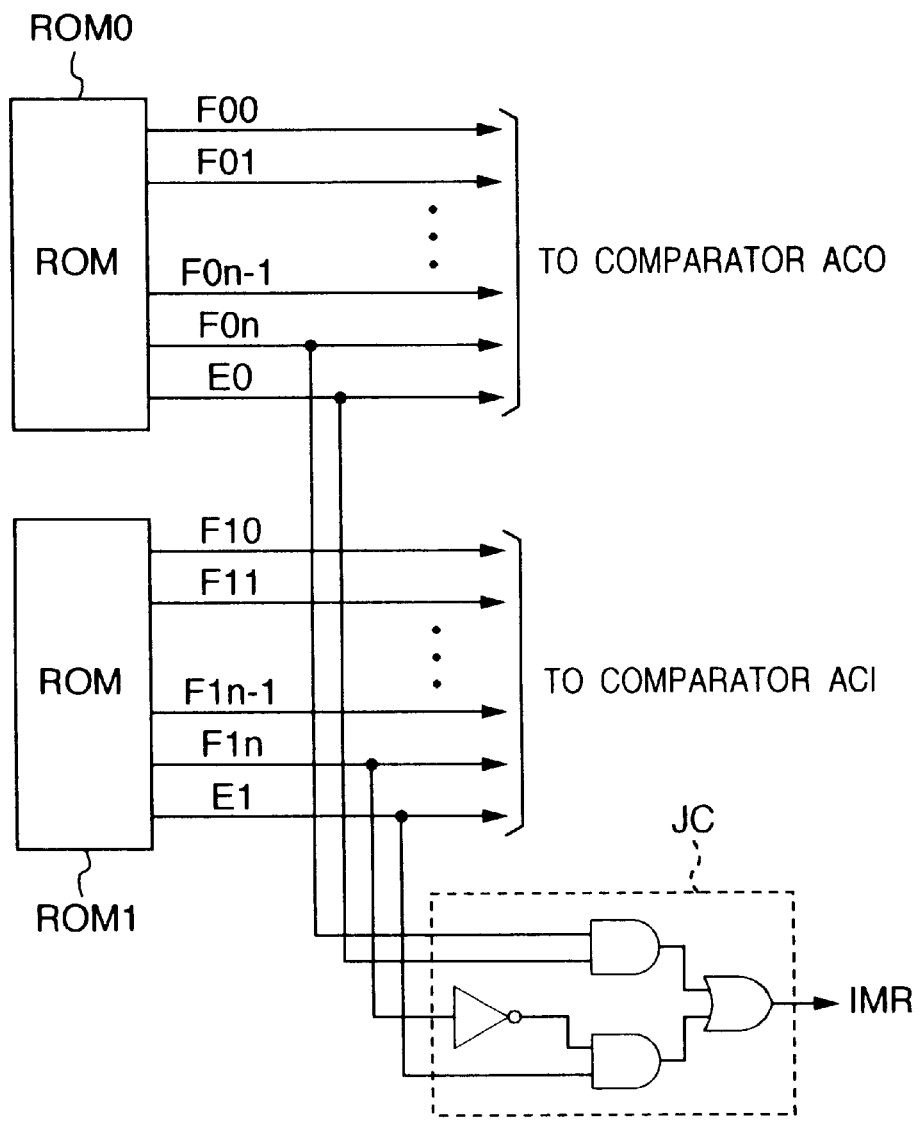
FIGS. 8A and 8B show judgement circuits of the DRAM of FIG. 1.

Shown in FIG. 8A is an example of the judgement circuit JC. In this case, the uppermost bit of (n+1) bits of address is used for selection of a memory mat ("0" for selection of the memory mat M0, and "1" for selection of the memory mat M1), while the lower n bits thereof are used for selection of a word line within the memory mat. The ROM0 and ROM1 each have (n+2) bits of output. One bit E0 of the output of the ROM0 is an enable signal which indicates whether or not the address stored in the ROM0 is valid, that is, whether or not to use the spare word line SW0 of the memory mat M0. When the enable signal E0 is "valid", the other (n+1) bits F00-F0n are compared with the internal address signal at the comparison circuit AC0. A similar explanation holds true even for the ROM1.

The judgement circuit JC uses the enable signals E0 and E1 and the uppermost address F0n and F1n of the outputs of the ROMs (ROM0, ROM1) to judge the presence or absence of the intermat replacement according to the truth tables of FIGS. 16A and 16B and to output the signal IMR. With respect to the output of the ROM0 (refer to FIG. 16A), when first E0=0 (when the address stored in the ROM0 is invalid), the spare word line SW0 is not used and thus the judgement circuit JC determines the presence of "within-mat replacement" regardless of F0n. When E0=1 and F0n=0, since the normal word line to be replaced by the spare word line SW0 is within the memory mat M0, the judgement circuit JC determines the presence of "within-mat replacement". When E0=1 and F0n=1, the normal word line to be replaced by the spare word line SW0 is within the memory mat M1, the judgement circuit JC determines the presence of "intermat replacement". In FIGS. 16A and 16B, reference symbol "X" stands for "don't care".

Even with respect to the output of the ROM1, judgement is carried out in a similar manner to the ROM0, but the judgement based on the F1n is reversed (refer to FIG. 16B).

Finally, a logical "OR" operation of both judgement results is carried out. That is, when at least one is "intermat replacement", the judgement circuit JC determines "intermat replacement" (IMR=1); whereas, when both are "within-mat replacement", the judgement circuit JC determines "within-mat replacement" (IMR=0). In particular, when E0=E1=0, that is, when no spare word line is used at all (when it is a perfect product or when the defects can be repaired only by the spare bit lines), the judgement circuit JC determines "within-mat replacement".

Figure 8B:
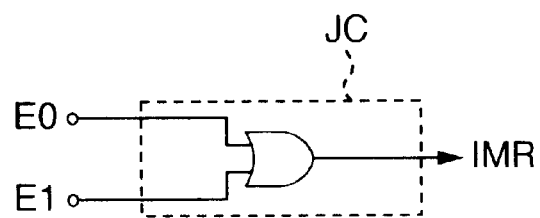

FIG. 8B shows a simplified form of the judgement circuit JC. This circuit does not perform such a judgement between the intermat replacement and within-mat replacement as mentioned above but merely judges use or non-use of the spare word lines. That is, the circuit takes a logical "OR" operation of the enable signals E0 and E1 and outputs the output signal IMR. More specifically, only when no spare word line is used at all, the signal IMR becomes zero. Accordingly, the judgement circuit of FIG. 8B has a probability of enabling the high-speed operation lower than the judgement circuit of FIG. 8A, but is advantageous over it in that the judgement circuit can be simplified in arrangement.

Note here that the input signals (E0, F0n, E1, F1n) of the judgement circuit JC and the output signal IMR are both D.C. signals. Thus, the input signals (E0, F0n, E1, F1n) will not change after data are once written in the ROM. Since the input signals do not change, the output signal IMR also does not change. Accordingly, the delay of these signals presents no problem and thus use of a wiring layer having a relatively large resistance is allowed. In the light of the above fact, reduction of chip area can be realized, a specific example of which will be given below.

Figure 9:
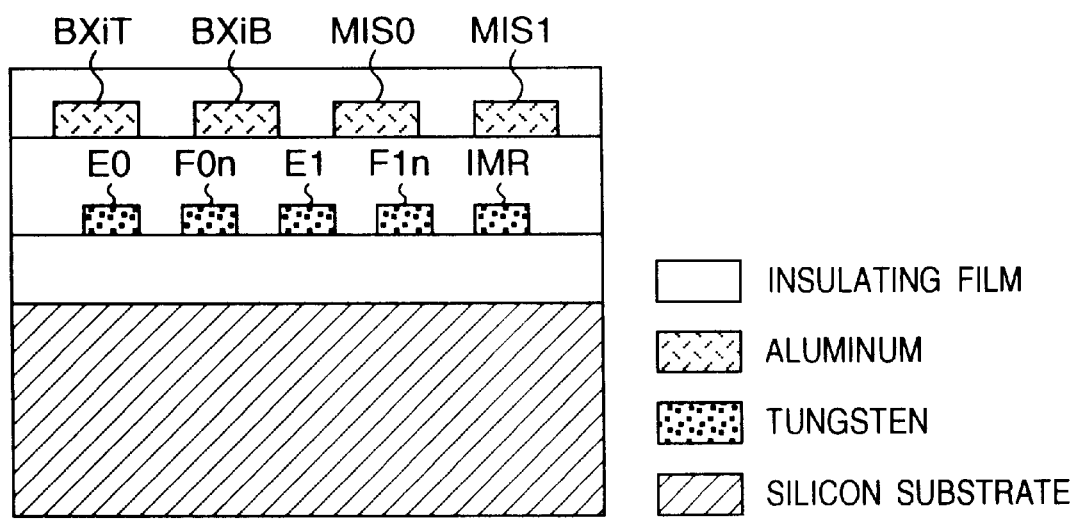
FIG. 9 is a cross-sectional view of signal wiring lines in the DRAM of FIG. 1.

FIG. 9 is an exemplary section of a signal wiring structure which allows reduction of a chip area. Since a delay in the internal address signals BXiT, BXiB or in the output signals MIS0, MIS1 largely affects the access time, an aluminum layer having a small resistance is used as the uppermost layer. However, such a wiring layer of the judgement circuit having a relatively large resistance as mentioned above is made up of a tungsten and/or polycrystalline silicon layer having a large resistance as a layer under the aluminum layer, with the width between the wiring lines being made small. With such a structure, it can be avoided that the chip area is increased by input/output signal wiring of the judgement circuit. This is effective, in particular, when the number of memory mats or the number of spare lines is large, because the increased number of memory mats or lines also involves an increased number of input signal lines in the judgement circuit. In FIG. 1, the number of memory mats has been set at 2 and the number of spare word lines has been set at one per memory mat for simplicity. However, when the number of memory mats is set at 8 (thus the address for selection of a memory mat comprises 3 bits) and the number of spare word lines per memory mat is set at 2, for example, the number of input signal lines in the judgement circuit is 64 (=8×2×(3+1)).

As has been explained above, the access time of the DRAM of the present embodiment is the same as that of the prior art when the intermat replacement is present, but can be made smaller than that of the prior art when the intermat replacement is not present. Accordingly, when the number of defects is relatively small, there is a high possibility that the defects can be repaired only by the within-mat replacement. In addition, since change-over of the timing is automatically carried out based on the values written in the ROM as mentioned above, it can be avoided that the number of test steps becomes larger than that in the prior art.

Embodiment 2

Figure 10:
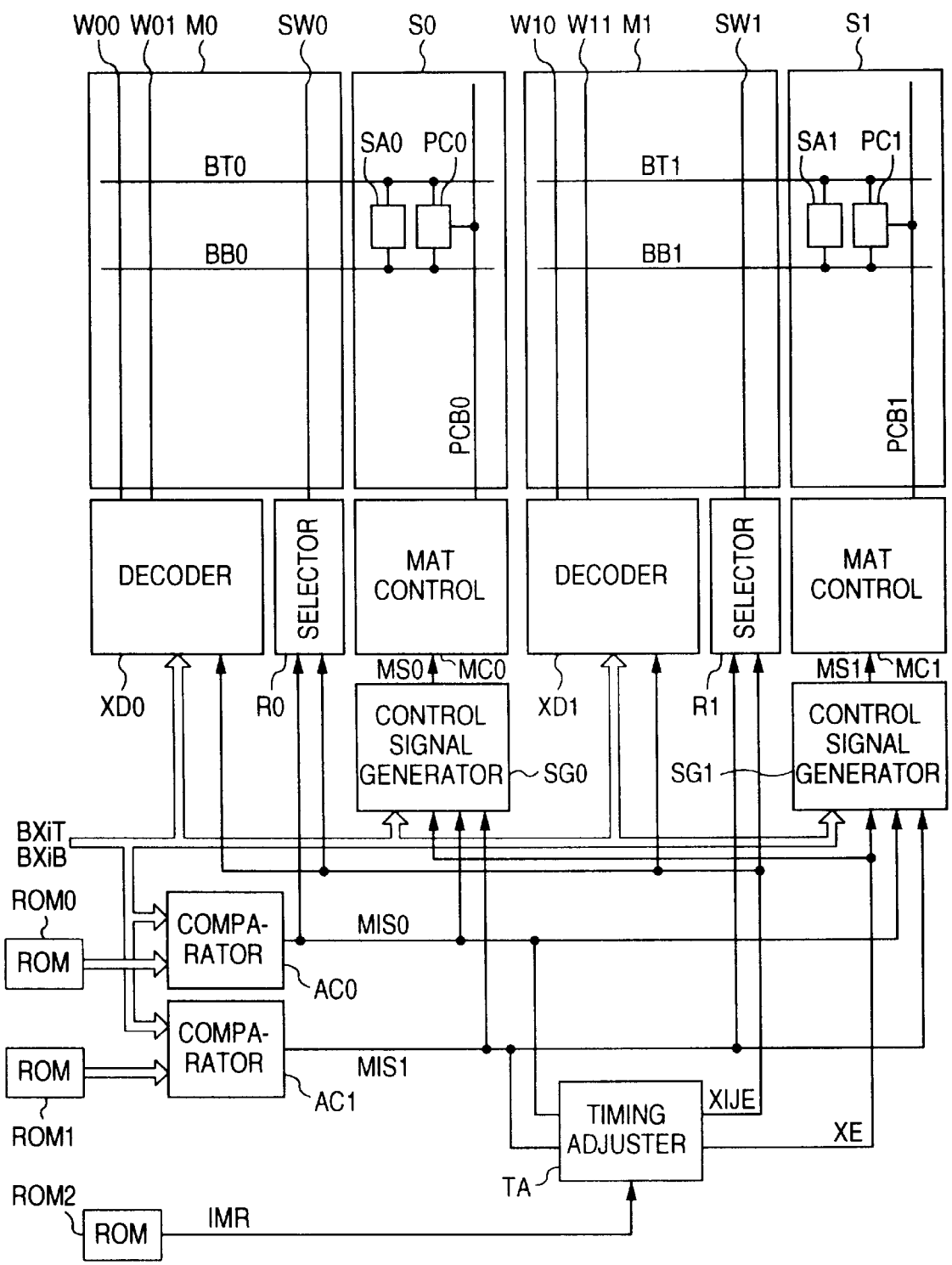
FIG. 10 shows a DRAM in accordance with a second embodiment of the present invention.

FIG. 10 shows a second embodiment when the present invention is applied to a DRAM, in which case the judgement circuit is replaced by a ROM2. Previously written in the ROM2 in a test mode is the presence or absence of the intermat replacement in such a manner that IMR=1 in the presence of the intermat replacement and IMR=0 in the absence of the intermat replacement. The ROM2 can comprise, for example, a fuse as in the ROM0 and ROM1.

The present embodiment is advantageous in that the need for the judgement circuit can be eliminated, the arrangement can be simplified and the occupied area can be made small, but is disadvantageous in that, in the test mode, such a step of judging the replacement type between the defective and spare word lines and writing it in the ROM (ROM2) is newly added. Thus, from the view-point of the (lack of a) test step, Embodiment 1 is superior to the Embodiment 2. Such an arrangement is also possible that whether or not to use the spare word line is previously written in the ROM2 so that, when the spare word line is not used, the ROM2 issues an output signal IMR of "0".

The operation of the present Embodiment 2 is substantially the same as that of Embodiment 1 and thus explanation thereof is omitted.

Embodiment 3

Figure 11:
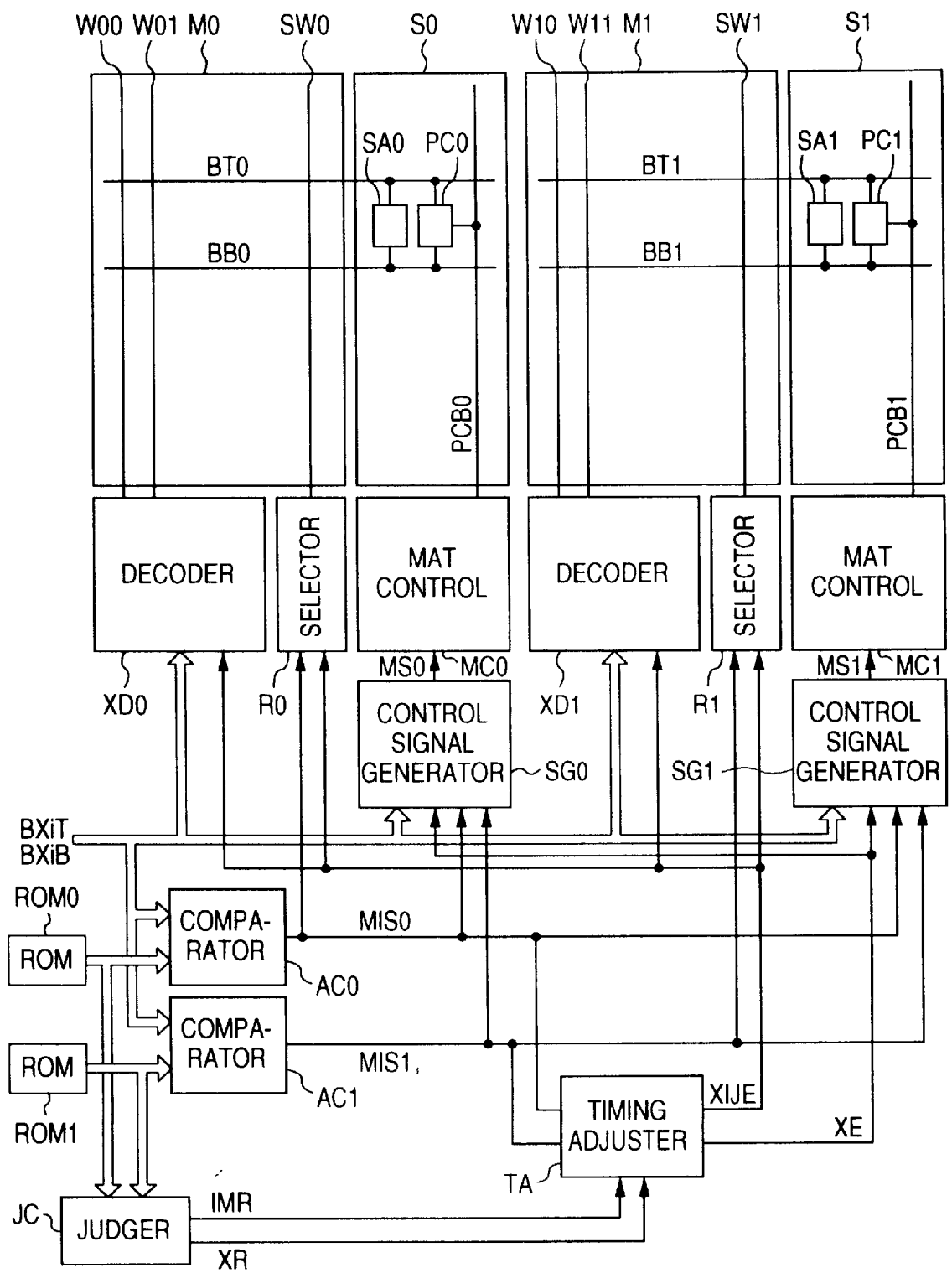
FIG. 11 shows a DRAM in accordance with a third embodiment of the present invention.

FIG. 11 shows a third embodiment when the present invention is applied to a DRAM. The present embodiment is featured in that the timing is adjusted not only by the presence or absence of the intermat replacement but also by the use or non-use of the spare word line. In the illustrated example, the judgement circuit JC receives outputs of the ROM0 and ROM1 and issues two output signals IMR and XR. As in the above embodiments, the signal IMR indicates the presence or absence of the intermat. The signal XR indicates whether or not to use the spare word line. When the spare word line is used, the signal XR is at high level ("1"), whereas, when the spare word line is not used (when it is a perfect product or the defects can be repaired only by the spare bit lines), the signal XR is at low level ("0").

Explanation will next be made as to the operation of the present embodiment. The operation of the present embodiment when the spare word line is used is substantially the same as that of Embodiment 1. In other words, the operation is as shown in FIGS. 3 and 4 when the intermat replacement is present (IMR=1), while, the operation is as shown in FIGS. 5 and 6 when the intermat replacement is not present (IMR=0). The present embodiment is featured in that, when no spare word lines are used at all, the operational speed can be made faster than that of FIGS. 5 and 6.

Figure 12:
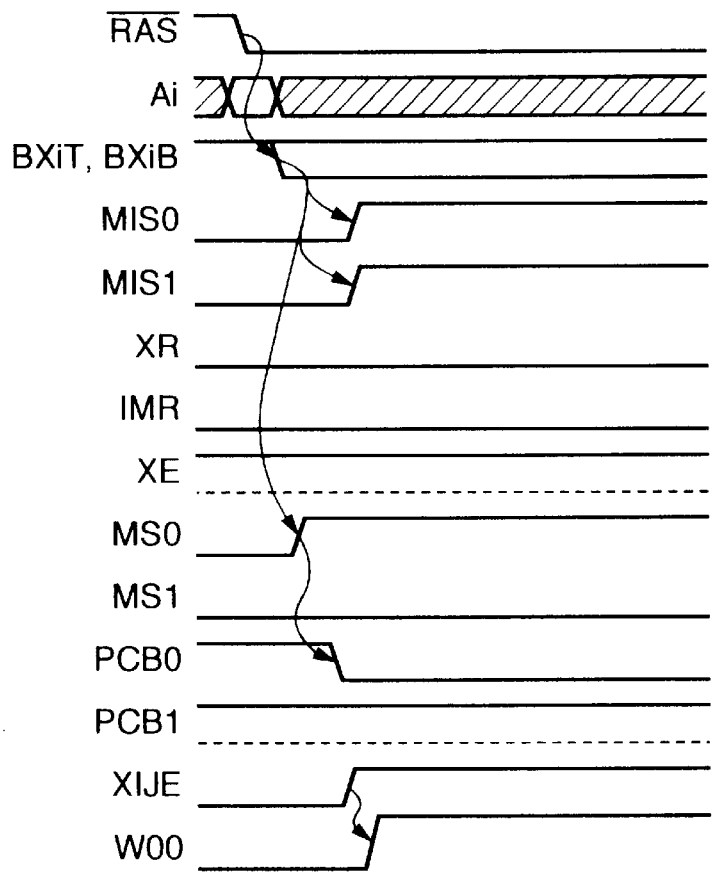
FIG. 12 are waveforms of signals appearing in the DRAM of FIG. 11.

The waveforms of signals are shown in FIG. 12. In the case of FIGS. 5 and 6, the timing signal XIJE must be made to rise after the outputs MIS0 and MIS1 of the comparison circuits are determined. This is because there is a possibility that the word line to be selected may change from the normal word line to the spare word line depending on the comparison results of the comparison circuits. To avoid this, the timing margin T2 is provided. However, when no spare word lines are used at all, there is no change possibility, which can eliminate the need for the provision of the timing margin T2, with the result that the rising timing of the timing signal XIJE can be made earlier. This leads to the fact that the timing of the word line selection and thus the access time can be made faster.

Figure 13:
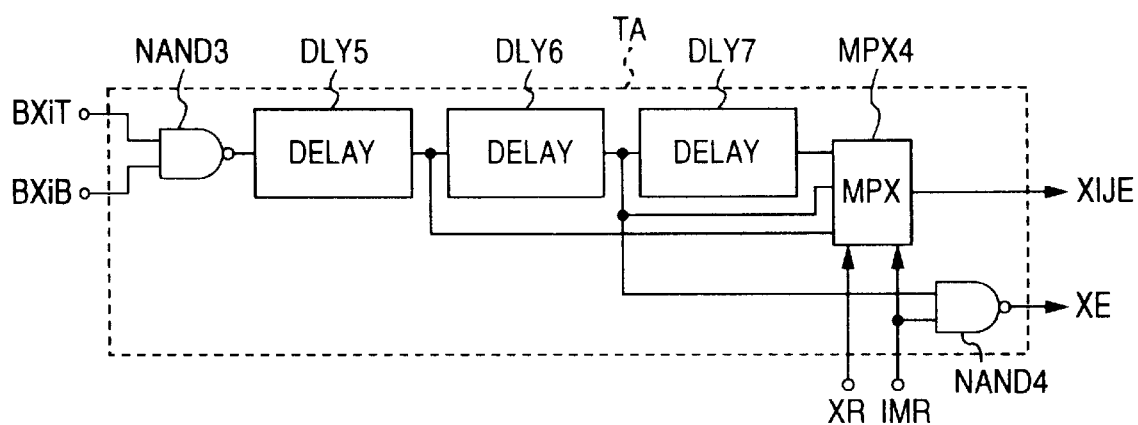
FIG. 13 is a circuit diagram of a timing adjustment circuit TA in the DRAM of FIG. 11.

Shown in FIG. 13 is an example of the timing adjustment circuit TA usable in the present embodiment. As in FIG. 7B, the internal address signals BXiT and BXiB are applied to a NAND gate NAND3 and an output of the gate NAND3 is delayed by delay circuits DLY5, DLY6 and DLY7. A multiplexer MPX4 selects an output of the delay circuit DLY5 regardless of the state of the signal IMR when the signal XR is at low level (no use of the spare word line), selects an output of the delay circuit DLY6 when the signal XR is at high level and the signal IMR is at low level (use of the spare word line only for the within-mat replacement), selects an output of the delay circuit DLY7 when the signals XR and IMR are both at high level (use of the spare word line and presence of intermat replacement), and then outputs the timing signal XIJE.

Meanwhile, the timing signal XE, when the signal IMR is at high level, transits from low level to high a constant time after the DRAM is put in the operational mode. That is, when the DRAM is put in the operational mode and one of the internal address signals transits from high level to low, the output of the NAND gate NAND3 shifts its level from low to high, delayed by the delay circuit DLY5 and DLY6, inverted by a NAND gate NAND4, and then output as the timing signal XE. When the signal IMR is at low level, one (signal IMR) of the inputs of the NAND gate NAND4 is at low level, and the output signal XIJE remains high.

Figure 14:
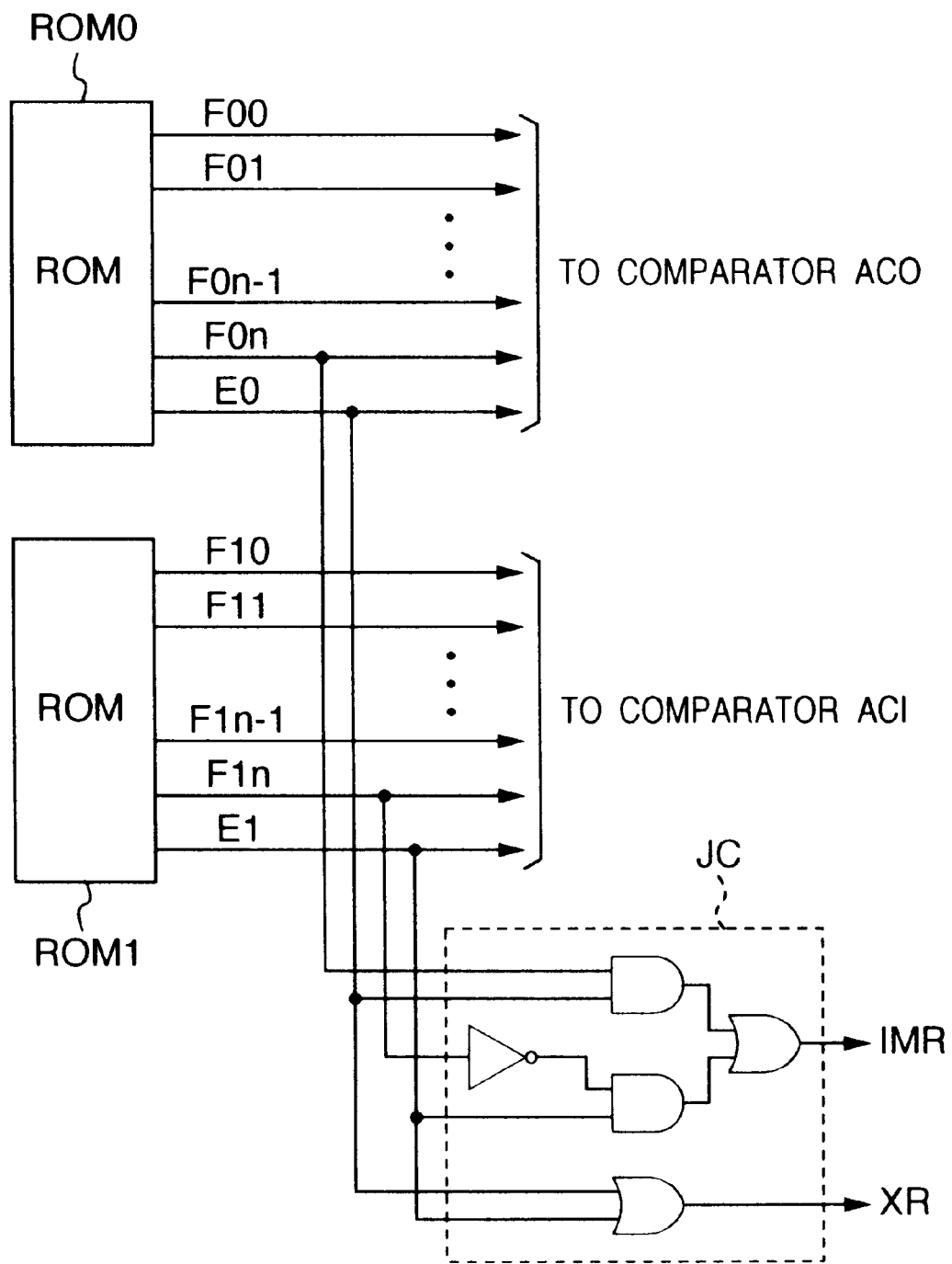
FIG. 14 is a circuit diagram of a judgement circuit JC in the DRAM of FIG. 11.

FIG. 14 shows an example of the judgement circuit JC usable in the present embodiment. How to generate the signal IMR is the same as in the case of FIG. 8. The signal XR is generated by performing a logical "OR" operation of the enable signals E0 and E1.

When the spare word lines are not used (when the signal XR is at low level), the present embodiment is made faster in operational speed than Embodiment 1. Accordingly, when the chip is a perfect product or when the number of defects therein is relatively small and thus the defects can be repaired only by the normal bit lines, the chip access time can be made further small because of no need for use of the spare word line. In addition, since timing change-over is automatically carried out based on the values previously written in the ROM as mentioned above, it can be avoided that the number of test steps is made larger than that in the prior art.

Figure 15:
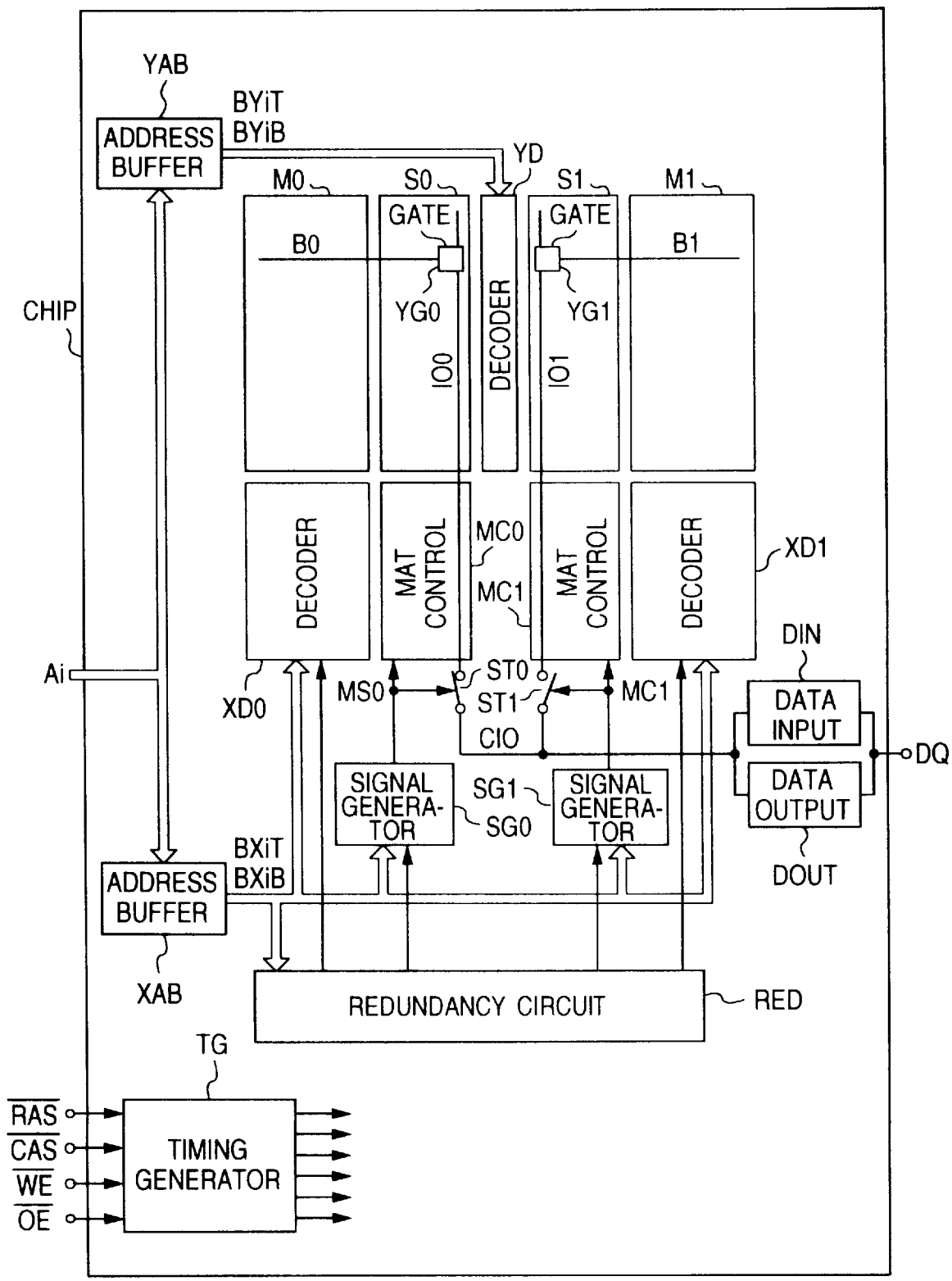
FIG. 15 is an entire block diagram of a DRAM to which the present invention is applied.

FIG. 15 shows an example of a DRAM to which the present invention is applied to repair defects in the word lines. In the drawing, reference symbol CHIP denotes a semiconductor memory chip having the DRAM mounted thereon. Symbol RED denotes a redundancy circuit which includes, as its constituent elements, ROMs, comparison circuits, a judgement circuit and a timing adjustment circuit as mentioned above. Symbol TG denotes a timing-signal generation circuit which externally receives the row address strobe signal/RAS, a column address probe signal/CAS, a write enable signal/WE and an output enable signal/OE; and generates various sorts of timing signals necessary in the memory chip. Symbol XAB denotes a row address buffer which receives an external address signal at its address terminal Ai and generates the internal address signals BXiT or BXiB. Symbol YAB denotes a column address buffer which receives the external address signal at its terminal Ai and generates an internal address signal BYiT or BYiB. Symbol DIN denotes a data input buffer which receives data at its data input/output terminal in a write mode. Symbol DOUT denotes a data output buffer which outputs data to its terminal DQ in a read mode.

Explanation will then be made as to the operation of this DRAM. The operations after the row address strobe signal/RAS is changed to its low level until the word line is selected have been detailed above and thus explanation thereof is omitted.

When a word line is selected, a signal is read out from an associated memory cell (not shown) onto an associated bit line. Next, the column address strobe signal/CAS is changed to its low level, and a column decoder YD selects the bit line on the basis of the internal address signal BYiT or BYiB generated by the column address buffer YAB. The selected bit line B0 is connected to an input/output line IO0 through the input/output gate YG0. In this connection, the bit line and input/output line are each actually a pair of lines as shown in FIG. 2 but illustrated as a single line for simplicity. The input/output line IO0 is further connected to a common input/output line CIO through a switch ST0 controlled by the mat select signal MS0. The illustrated example shows an activated state of the memory mat M0. That is, the switch ST0 associated with the memory mat M0 is in its ON state while the switch ST1 associated with the memory mat M1 is in its OFF state. In the read mode, data on the common input/output line CIO is read out to the data input/output terminal DQ through the data output buffer DOUT. In the write mode, the data applied onto the terminal DQ is written onto the bit line B0 through the data input buffer DIN, common input/output line CIO, switch ST0, input/output line IO0 and input/output gate YG0.

As will be seen from the foregoing explanation, input/output change-over is carried out by the mat select signals MS0 and MS1. When a memory mat to be activated through the defect repair is changed, for example, from the memory mat M0 to the memory mat M1, not the signal MS0 but the signal MS1 becomes high, so that the input/output line to be connected to the data input buffer DIN and data output buffer DOUT is also automatically changed from the input/output line IO0 to the input/output line IO1.

The example where the present invention is applied for the redundancy in the word lines of the DRAM has been detailed above, since the example is most remarkable in the effect of the present invention. However, the present invention may also be applied not only to the redundancy of the word lines but also to the redundancy of the bit lines. It will be further appreciated that the present invention can be applied not only to the DRAM but also to such other semiconductor memories as SRAMs or nonvolatile memories.

In accordance with the present embodiment of the present invention, since the operational mode is set (by the mode setting means JC) depending on the replacement type between the normal memory cell and spare memory cell, and timing adjustment is carried out (by the timing adjusting means TA) depending on the operational mode, wasted time can be eliminated and the access time can be made small.

Further, the mode setting means judges whether or not a defective memory cell and a spare memory cell for it belong to the same memory mat or whether or not to use the spare memory cell, and the operational mode is set on the basis of the judgement result. Thus, when the intermat replacement is absent or when the spare memory cell is not used, a high-speed access can be realized. Furthermore, since the above judgement is automatically carried out based on the contents (first ROM) having addresses of defective ones of the normal memory cells stored therein, an increase in the number of test steps over the prior art can be avoided.

Since the input/output signals of the judgement circuit will not vary during the operation and the wiring layer thereof can have a large resistance without involving any trouble, the wiring layer of the input/output signals can be made larger in resistive value per unit length than the wiring layer of the address signal, and therefore a chip area can be made small. Further, when the wiring layer of the address signal comprises an aluminum layer as the uppermost layer, the layer of the input/output signals of the judgement circuit comprises a tungsten or polycrystalline layer having a large resistance and disposed under the aluminum layer, and a wiring width of lines in the wiring layer is made small; the chip area can be made further small and this is highly effective when the number of memory mats or the number of spare lines are large.

Furthermore, when it is previously written in the ROM (second ROM) whether or not a defective memory cell and a spare memory cell to be replaced by it belong to the same memory mat or whether or not to use the spare memory cell, the aforementioned judgement circuit can be eliminated.

What is claimed is:

1. A semiconductor memory having a redundancy circuit, comprising:
   a plurality of memory mats each including a plurality of normal memory cells and a plurality of spare memory cells;
   a plurality of memory mat control circuits for controlling said plurality of memory mats respectively;
   first ROMs for storing therein addresses of defective ones of said normal memory cells;
   comparison circuits for comparing defective addresses output by said first ROMs with an address signal;
   spare selection means for selecting a spare memory cell to replace a defective memory cell on the basis of an output of one of said comparison circuits;

mode setting means for setting an operational mode associated with replacement type in replacing said defective memory cell with said spare memory cell selected by said spare selection means; and timing adjustment means for changing timing of control signals applied to said memory mat control circuits on the basis of an output of said mode setting means.

2. A semiconductor memory having a redundancy circuit as set forth in claim 1, wherein said mode setting means judges whether or not said defective memory cell and said spare memory cell to replace it belong to the same memory mat and sets the operational mode on the basis of its judgement result.

3. A semiconductor memory having a redundancy circuit as set forth in claim 2, wherein said mode setting means includes a judgement circuit for receiving the outputs of said first ROMs and for judging whether or not said defective memory cell and said spare memory cell to replace said defective memory cell belong to the same memory cell.

4. A semiconductor memory having a redundancy circuit as set forth in claim 3, wherein a wiring layer of input/output signals of said judgement circuit has a resistive value per unit length larger than a wiring layer of said address signal.

5. A semiconductor memory having a redundancy circuit as set forth in claim 4, wherein the wiring layer of the input/output signals of said judgement circuit is provided as a layer under the wiring layer of said address signal.

6. A semiconductor memory having a redundancy circuit as set forth in claim 2, wherein said mode setting means includes a second ROM for previously writing therein whether or not said defective memory cell and said spare memory cell to replace said defective memory cell belong to the same memory mat or whether or not to use the spare memory cell, and sets the operational mode on the basis of the written contents of said second ROM.

7. A semiconductor memory having a redundancy circuit as set forth in claim 2, wherein said mode setting means judges whether or not to use the spare memory cell and sets the operational mode on the basis of its judgement result.

8. A semiconductor memory having a redundancy circuit as set forth in claim 1, wherein said mode setting means judges whether or not to use the spare memory cell and sets the operational mode on the basis of its judgement result.

9. A semiconductor memory having a redundancy circuit as set forth in claim 8, wherein said mode setting means includes a judgement circuit for receiving the outputs of said first ROMs and judging whether or not said spare memory cell is used.

10. A semiconductor memory having a redundancy circuit as set forth in claim 9, wherein a wiring layer of input/output signals of said judgement circuit has a resistive value per unit length larger than a wiring layer of said address signal.

11. A semiconductor memory having a redundancy circuit as set forth in claim 8, wherein said mode setting means includes a second ROM for previously writing therein whether or not said defective memory cell and said spare memory cell to replace said defective memory cell belong to the same memory mat or whether or not to use the spare memory cell, and sets the operational mode on the basis of the written contents of said second ROM.

12. A semiconductor memory comprising:
    a first memory mat having a plurality of first normal memory cells and a plurality of first spare memory cells;
    a second memory mat having a plurality of second normal memory cells and a plurality of second spare memory cells; and
    a redundancy circuit including:
        a first data storing circuit for storing a first defective address;
        a second data storing circuit for storing a second defective address;
        a first comparing circuit for comparing the first defective address and an access address and outputting a first hit signal according to a result of the comparison;
        a second comparing circuit for comparing the second defective address and the access address and outputting a second hit signal according to a result of the comparison;
        a first selection circuit for selecting one of the plurality of first spare memory cells according to the first hit signal;
        a second selection circuit for selecting one of the plurality of second spare memory cells according to the second hit signal;
        a judgment circuit for outputting a judgment signal when the first defective address satisfies a predetermined condition; and
        a timing adjustment circuit for controlling the selection timing of the first selection circuit according to the judgment signal.

13. A semiconductor memory according to claim 12, wherein the predetermined condition is satisfied when the first defective address is programmed to replace the second normal memory cell with the selected first spare memory cell, and is not satisfied when the first defective address is programmed to replace the first normal memory cell with the selected first spare memory cell.

14. A semiconductor memory according to claim 13, wherein said first memory mat includes a first spare word line coupled to the plurality of first spare memory cells, and said second memory mat includes a second spare word line coupled to the plurality of second spare memory cells; and
    wherein the first selection circuit is a first driver of the first spare word line, and the second selection circuit is a second driver of the second spare word line.

15. A semiconductor memory according to claim 14, wherein said semiconductor memory is a dynamic random access memory.

* * * * *